US010170636B2

(12) United States Patent
Chang et al.

(10) Patent No.: US 10,170,636 B2
(45) Date of Patent: Jan. 1, 2019

(54) GATE-TO-BULK SUBSTRATE ISOLATION IN GATE-ALL-AROUND DEVICES

(71) Applicant: International Business Machines Corporation, Armonk, NY (US)

(72) Inventors: Josephine B. Chang, Bedford Hills, NY (US); Michael A. Guillorn, Cold Springs, NY (US); Isaac Lauer, Yorktown Heights, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/603,945

(22) Filed: May 24, 2017

(65) Prior Publication Data

US 2017/0256655 A1 Sep. 7, 2017

Related U.S. Application Data

(62) Division of application No. 15/055,830, filed on Feb. 29, 2016, now Pat. No. 9,748,404.

(51) Int. Cl.
*H01L 29/786* (2006.01)
*H01L 29/06* (2006.01)
(Continued)

(52) U.S. Cl.
CPC .. *H01L 29/78696* (2013.01); *H01L 21/02236* (2013.01); *H01L 21/31111* (2013.01);
(Continued)

(58) Field of Classification Search
CPC . H01L 51/5237; H05K 5/0017; H05K 5/0234
(Continued)

(56) References Cited

U.S. PATENT DOCUMENTS

2006/0157687 A1* 7/2006 Doyle ............... H01L 29/66795 257/19
2013/0270512 A1* 10/2013 Radosavljevic ............................ H01L 21/823821 257/9

(Continued)

OTHER PUBLICATIONS

Josephine B. Chang, et al., "Method for Fabricating a Semiconductor Device Including Gate-To-Bulk Substrate Isolation (As Amended)", U.S. Appl. No. 15/055,830, filed Feb. 29, 2016.

(Continued)

*Primary Examiner* — Andy Huynh
(74) *Attorney, Agent, or Firm* — Cantor Colburn LLP; Vazken Alexanian

(57) ABSTRACT

A method for fabricating a semiconductor device comprises forming a sacrificial layer of a first semiconductor material on a substrate, a layer of a second semiconductor material on the sacrificial layer, and a layer of a third semiconductor material on the layer of the second semiconductor material. Portions of the layer of the deposited material are removed to form a first nanowire arranged on the sacrificial fin and a second nanowire arranged on the first nanowire. An oxidizing process is performed that forms a first layer of oxide material on exposed portions of the second nanowire and a second layer of oxide material on exposed portions of the sacrificial fin, the first layer of oxide material having a first thickness and the second layer of oxide material having a second thickness, where the first thickness is less than the second thickness.

17 Claims, 13 Drawing Sheets

(51) Int. Cl.
*H01L 29/423* (2006.01)
*H01L 29/66* (2006.01)
*H01L 21/02* (2006.01)
*H01L 21/311* (2006.01)

(52) U.S. Cl.
CPC .... *H01L 29/0673* (2013.01); *H01L 29/42392* (2013.01); *H01L 29/66439* (2013.01); *H01L 29/66772* (2013.01); *H01L 29/78654* (2013.01)

(58) Field of Classification Search
USPC .......................................................... 257/616
See application file for complete search history.

(56) References Cited

U.S. PATENT DOCUMENTS

2015/0034899 A1* 2/2015 Ching ............... H01L 29/66439 257/9
2017/0117375 A1* 4/2017 Kim .................... H01L 29/0673

OTHER PUBLICATIONS

List of IBM Patents or Patent Applications Treated as Related; (Appendix P), Filed Jun. 21, 2017, 2 pages.

* cited by examiner

GATE-TO-BULK SUBSTRATE ISOLATION IN GATE-ALL-AROUND DEVICES

DOMESTIC PRIORITY

This application is a Divisional of Non-Provisional application Ser. No. 15/055,830, entitled "GATE-TO-BULK SUBSTRATE ISOLATION IN GATE-ALL-AROUND DEVICES", filed Feb. 29, 2016 which is incorporated herein by reference in its entirety.

BACKGROUND

The present invention generally relates to complimentary metal-oxide semiconductors (CMOS) and metal-oxide-semiconductor field-effect transistors (MOSFET), and more specifically, to gate-all-around devices that the gate fully surround the channel regions of the devices.

The MOSFET is a transistor used for switching electronic signals. The MOSFET has a source, a drain, and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Since the nanowire is suspended, the channel region of a nanowire device having 360 degrees of exposed area. The gate stack may be formed around the channel region of the nanowire to form a gate-all-around-device. The nanowire may provide even more surface area and greater channel length than a finFET device or planar FET device in a given region of a substrate. Nanowire FETs may be formed from stacked nanowires providing even greater layout density. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the invention, a method for fabricating a semiconductor device comprises forming a sacrificial layer of a first semiconductor material on a substrate, a layer of a second semiconductor material on the sacrificial layer, and a layer of a third semiconductor material on the layer of the second semiconductor material. Portions of the layer of the third semiconductor material, portions of the second semiconductor material, and portions of the sacrificial layer to expose portions of the substrate are removed to form a sacrificial fin in the sacrificial layer, a first nanowire arranged on the sacrificial fin and a second nanowire arranged on the first nanowire. A layer of insulating material is deposited on the substrate adjacent to the sacrificial fin. Etching is performed to remove exposed portions of the first nanowire. An oxidation process is performed that forms a first layer of oxide material on exposed portions of the second nanowire and a second layer of oxide material on exposed portions of the sacrificial fin, the first layer of oxide material having a first thickness and the second layer of oxide material having a second thickness, where the first thickness is less than the second thickness.

According to another embodiment of the present invention, a method for fabricating a semiconductor device comprises forming a sacrificial layer of a first semiconductor material on a substrate, a layer of a second semiconductor material on the sacrificial layer, and a layer of a third semiconductor material on the layer of the second semiconductor material. Portions of the layer of the third semiconductor material, portions of the second semiconductor material, and portions of the sacrificial layer are removed to form a sacrificial fin in the sacrificial layer, a first nanowire arranged on the sacrificial fin and a second nanowire arranged on the first nanowire. A layer of insulator material is deposited in trenches defined by the sacrificial layer adjacent to the sacrificial fin. Exposed portions of the first nanowire are removed. An oxidizing process is performed that forms a first layer of oxide material on exposed portions of the second nanowire and a second layer of oxide material on exposed portions of the sacrificial fin, the first layer of oxide material having a first thickness and the second layer of oxide material having a second thickness, where the first thickness is less than the second thickness.

According to yet another embodiment of the present invention, a semiconductor device comprises a substrate, a fin arranged on the substrate and a layer of oxide material arranged on the fin. A nanowire comprising a semiconductor material is arranged over the layer of oxide material where the layer of oxide material is disposed between the fin and the nanowire. A gate stack is arranged around the nanowire and over the layer of oxide material.

BRIEF DESCRIPTION OF THE DRAWINGS

FIG. 2 illustrates a side view of a substrate that comprises a first substrate material, a layer of selectively oxidizable material (sacrificial layer) formed on the substrate, and a stack of nanowire material layers formed on the layer of selectively oxidizable material.

FIG. 3 illustrates a side view a stacks of nanowires that have been formed on the layer of selectively oxidizable material.

FIG. 4 illustrates a side view following an anisotropic etch process that removes exposed portions of the layer of selectively oxidizable material.

FIG. 5 illustrates a side view following the formation of a shallow trench isolation (STI) region between the base of each fin.

FIG. 6 illustrates a side view following lithographic patterning and etching process that removes exposed stacks of nanowires.

FIG. 7 illustrates a cut-away view along the line A-A (of FIG. 8) of the resultant structure following the removal of the mask.

FIG. 8 illustrates a top view of the resultant structure shown in FIG. 7.

FIG. 9 illustrates a cut-away view through the second nanowires following the removal of exposed portions of the first nanowires (of FIG. 7).

FIG. 10 illustrates a cut-away view along the line A-A (of FIG. 11) following an oxidation process.

FIG. 11 illustrates a top view of the first oxide layer and the second oxide layer following the oxidation process described above in FIG. 10.

FIG. 12 illustrates a cut-away view along the line A-A (of FIG. 13) following the formation of a gate stack over channel regions of the second nanowires.

FIG. 13 illustrates a top view of the gate stack, spacers, and an inter-level dielectric layer that is formed over source/drain regions of the device.

FIG. 14 illustrates a side view following the formation of a sacrificial gate and spacers over portions of the stacks of nanowires and the STI region.

FIG. 15 illustrates a top view following the formation of the sacrificial gate and the spacers along sidewalls of the sacrificial gate.

FIG. 16 illustrates a top view following the formation of source/drain regions adjacent to the spacers.

FIG. 17 illustrates a top view following the deposition of an inter-level dielectric layer over the exposed source/drain regions (of FIG. 16).

FIG. 18 illustrates a top view of the resultant structure following the removal of the sacrificial gates (of FIG. 17) to form cavities that expose the channel regions of the stack of nanowires.

FIG. 19 illustrates a cut-away view along the line A-A (of FIG. 18) following the removal of the sacrificial gate (of FIG. 17).

FIG. 20 illustrates a cut-away view through the channel region of the device following a selective isotropic etching process that removes exposed portions of the first nanowires.

FIG. 21 illustrates a cut-away view of the channel region of the device following an oxidation process that forms a first oxide layer on exposed surfaces of the second nanowires.

FIG. 22 illustrates the resultant structure following the formation of a gate stack in the cavity that is formed in a similar manner as discussed above in FIG. 12.

FIG. 23 illustrates a side view following the formation of the stacks of nanowires and the sacrificial fins.

FIG. 24 illustrates a side view following the formation of the STI region adjacent to the stacks of nanowires using a similar process as described above in FIG. 5.

FIG. 25 illustrates a side view following the formation of the gate stack over the nanowires.

DETAILED DESCRIPTION

Stacked nanowire devices may be formed by, for example, forming alternating layers of semiconductor materials on a substrate. For example, alternating layers of silicon germanium and silicon may be formed on a substrate and patterned into a stack of nanowires using, for example, lithographic patterning and etching process such as, for example, reactive ion etching (ME) or another suitable etching process.

During the fabrication process, the nanowires in the stack of nanowires may be isolated by, for example, performing a selective isotropic etching process that undercuts the selected nanowires to expose the selected nanowires. For example, a nanowire stack having alternating layers of silicon germanium and silicon may be etched to selectively remove the silicon germanium nanowires such that suspended silicon nanowires remain having a channel region that is exposed 360 degrees such that subsequently a gate stack may be formed that surrounds the channel region of the silicon nanowires in a gate-all-around arrangement.

Figure 1:
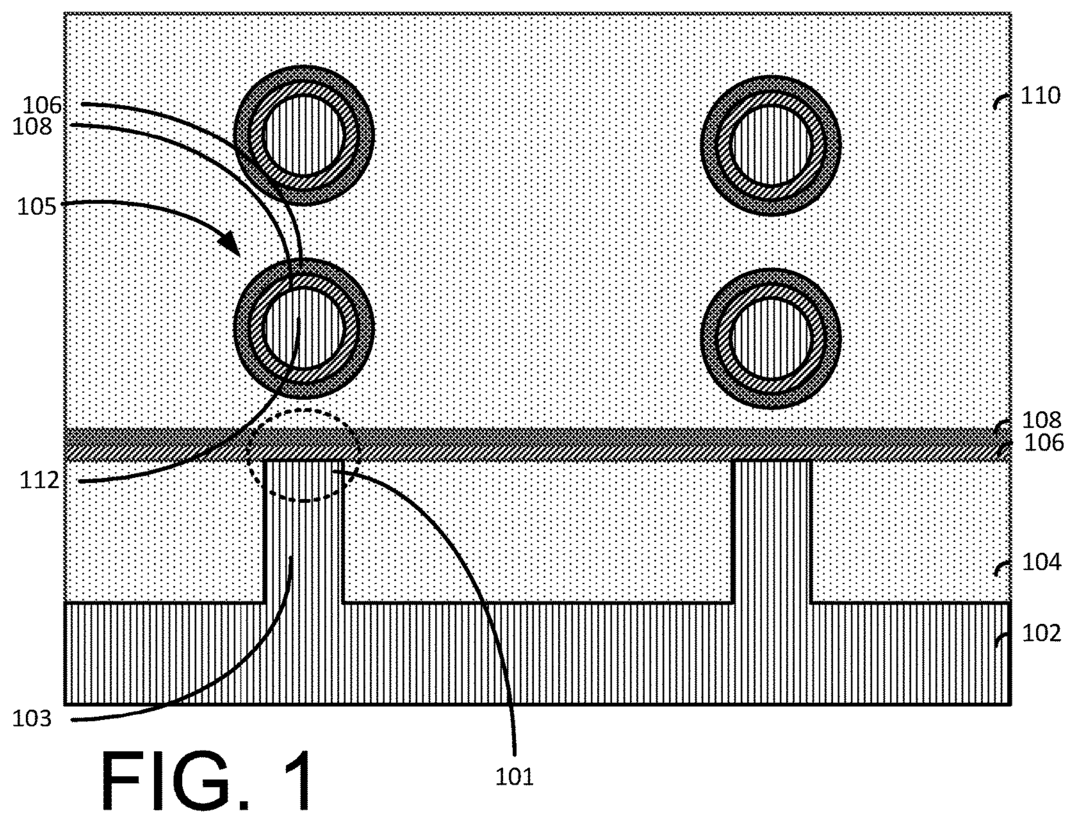
FIG. 1 illustrates an example cut-away view through a channel region of a stacked nanowire device.

FIG. 1 illustrates an example cut-away view through a channel region of a stacked nanowire device. The example device includes a bulk semiconductor substrate 102 with fins 103 formed in the bulk substrate 102 and an inter-level dielectric layer 104 arranged on the substrate 102. The channel regions of the nanowires 112 are formed from a semiconductor material. The gates are formed by depositing a layer of gate dielectric material 106 around the channel regions of the nanowires 112 and depositing a layer of workfunction metal 108 around the layer of gate dielectric material 106. Once the layer of gate dielectric material 106 and the layer of work function metal 108 are deposited, a gate conductor material 110 is deposited over the layer of work function metal 108.

In the illustrated example, the layer of gate dielectric material 106 and the layer of work function metal 108 are also deposited over the fins 103 such that a layer of gate dielectric material 106 and a layer of work function metal 108 are arranged between the fins 103 and the nanowires 112. Such an arrangement causes an undesirable capacitive region 101 between the gate 105 and the bulk substrate 102.

FIGS. 2-13 illustrate an exemplary method for forming a gate-all-around device on a bulk substrate that substantially avoids forming the undesirable capacitive region described above in FIG. 1.

Figure 2:
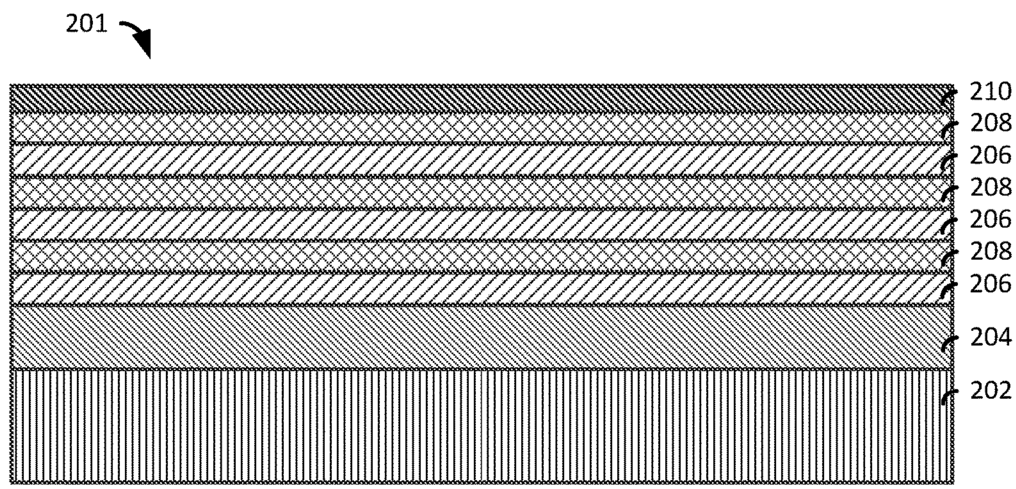
FIGS. 2-13 illustrate an exemplary method for forming a gate-all-around device on a bulk substrate that substantially avoids forming the undesirable capacitive region described above in FIG. 1.

FIG. 2 illustrates a side view of a substrate 202 that comprises a first semiconductor material, a layer of selectively oxidizable material (sacrificial layer) 204 formed on the substrate 202, and a stack of nanowire material layers 201 formed on the layer of selectively oxidizable material 204. A hardmask layer 210 is deposited on the stack of nanowire material layers 201.

Non-limiting examples of suitable materials for the substrate 202 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

In the illustrated embodiment the layer of selectively oxidizable material 204 includes a silicon germanium (SiGe) material that will be described in further detail below.

The stack of nanowire material layers 201 is arranged on the layer of selectively oxidizable material 204. The nanowire material layers in the illustrated embodiment include a first nanowire material layer 206 and a second nanowire material layer 208 arranged on the first nanowire material layer 206. The stack of nanowire material layers 201 may include any number of alternating nanowire material layers 206 and 208. In the illustrated embodiment, the first nanowire material layer 206 includes a silicon germanium material and the second nanowire material layer 208 includes a silicon material. In alternate exemplary embodiments, the first nanowire material layer 206 may be a silicon material while; the second nanowire material layer may be silicon germanium. The stack of nanowire material layers 201 may be formed by any suitable process. The germanium concentration (atomic concentration) in the SiGe layer ranges from about 15% to 99% and more preferably from about 25% to 60%. The Si/SiGe stack can be formed by epitaxially growth by using the layer of selectively oxidizable material 204 as the seed layer. The epitaxial growth can be done by any suitable techniques such as ultrahigh vacuum chemical vapor deposition (UHVCVD) rapid thermal chemical vapor deposition (RTCVD), Metalorganic Chemical Vapor Deposition (MOCVD), low-pressure chemical vapor deposition (LPCVD), limited reaction processing CVD (LRPCVD), molecular beam epitaxy (MBE). Each layer is stacked nanowire has a non-limiting thickness ranging from about 3-20 nm, more preferably about 5-10 nm.

In the illustrated exemplary embodiment, the layer of selectively oxidizable material 402 includes a SiGe material having a percentage of Ge of about 10% to 20%. The first nanowire material layer 206 includes another SiGe material having a percentage of Ge of about 20% to 50%. The selectively oxidizable SiGe layer should have a Ge concentration of at least 10% less than the SiGe in the nanowire stack, so that the SiGe in the nanowire stack can be removed selectively to the selectively oxidizable SiGe during the nanowire suspension step.

The hardmask layer 210 may include, for example, silicon oxide, silicon nitride (SiN), SiOCN, SiBCN or any suitable combination of those. The hardmask layer 210 may be deposited using a deposition process, including, but not limited to, PVD, CVD, PECVD, or any combination thereof.

Figure 3:
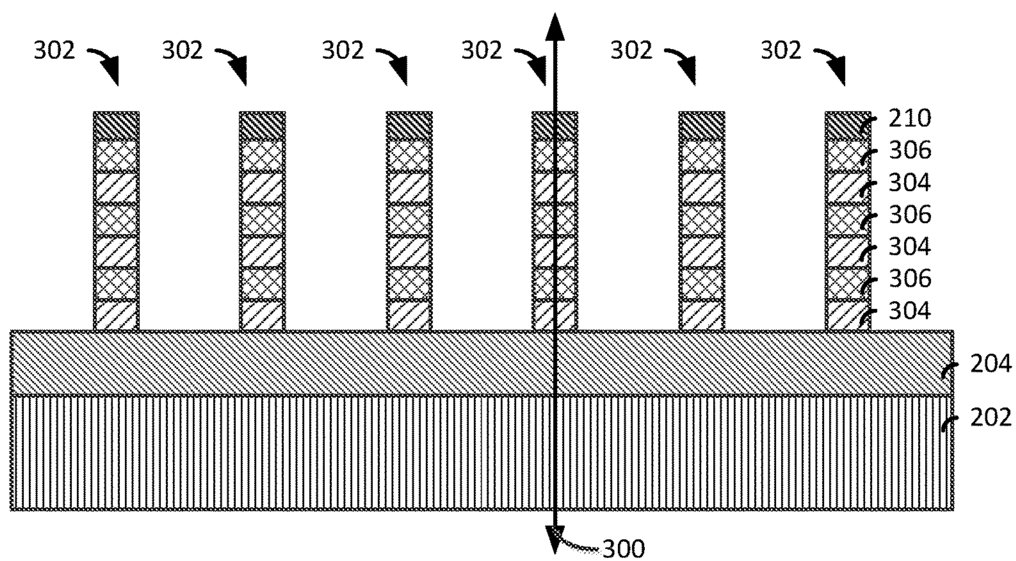

FIG. 3 illustrates a side view a stacks of nanowires 302 that have been formed on the layer of selectively oxidizable material 204. The stack of nanowires 302 may be formed by any suitable lithographic patterning and etching process such as, for example, a reactive ion etching (ME) process that removes exposed portions of the stack of nanowire material layers 201 and exposes portions of the layer of selectively oxidizable material 204 to form first semiconductor material nanowires (first nanowires) 304 and second semiconductor material nanowires (second nanowires) 306. The stack of nanowires 302 are arranged substantially coplanar as indicated by the line 300. Alternatively, a sidewall image transfer process can be used to pattern the stacked nanowires.

Figure 4:
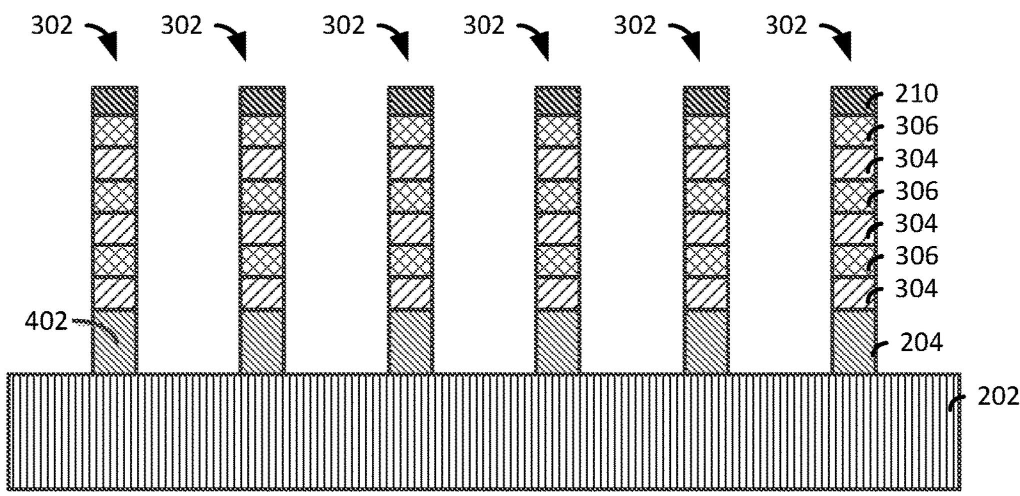

FIG. 4 illustrates a side view following an anisotropic etch process that removes exposed portions of the layer of selectively oxidizable material 204. The etching process exposes portions of the substrate 202 and forms sacrificial fins 402 between the substrate 202 and the stacks of nanowires 302. Though the illustrated exemplary embodiment shows the formation of sacrificial fins 402 by exposing the substrate 202, alternate exemplary embodiments may not expose the substrate 202 and may pattern the sacrificial fins 402 by removing portions of the layer of selectively oxidizable material 204 without exposing the substrate 202. I.e., the etching process that forms the sacrificial fins 402 is shallower and does not expose the substrate 202.

Figure 5:
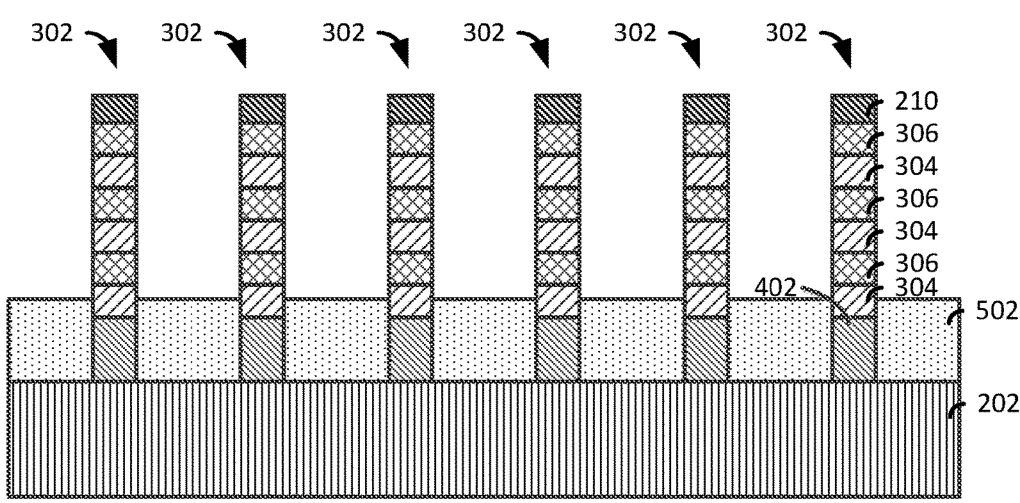

FIG. 5 illustrates a side view following the formation of a shallow trench isolation (STI) region 502 adjacent to the sacrificial fins 402. The STI region 502 may be formed by, any suitable process including, for example, filling the trenches between the stacks of nanowires 302 with an insulating material, such as silicon dioxide, planarizing the insulating material with a process such as, for example, chemical mechanical polishing (CMP), and performing a selective etching process that reduces the thickness of the STI region 502 to a desired thickness.

In the illustrated embodiment, at least one isolation region is a shallow trench isolation region ("STI"). However, the isolation region 502 may be a trench isolation region, a field oxide isolation region (not shown), or any other type of isolation region. The isolation region 502 provides isolation between neighboring gate structure regions, and may be used when the neighboring gates have opposite conductivities, e.g., nFETs and pFETs. The isolation region 502 also provides isolation between neighboring fins, and between the gate and the substrate between fins.

Figure 6:
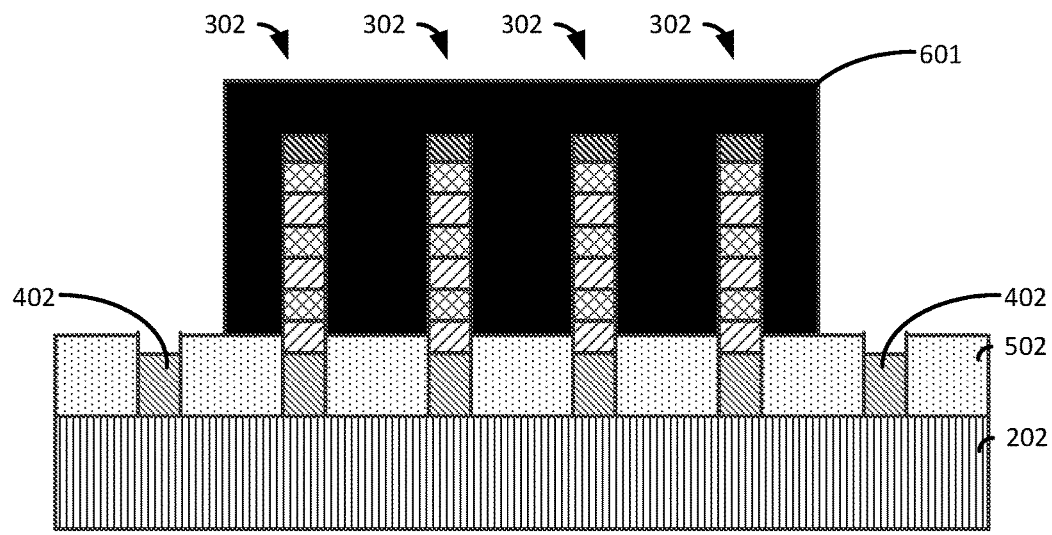

FIG. 6 illustrates a side view following lithographic patterning and etching process that removes exposed stacks of nanowires 302. In one embodiment, the process includes patterning a mask 601 over some of the stacks of nanowires 302 and performing a selective etching process that removes the exposed stacks of nanowires 302 and exposes portions of the sacrificial fins 402. Suitable masks include photoresists, electron-beam resists, ion-beam resists, X-ray resists, and etch resists. The resist may a polymeric spin on material or a polymeric material.

Figure 7:
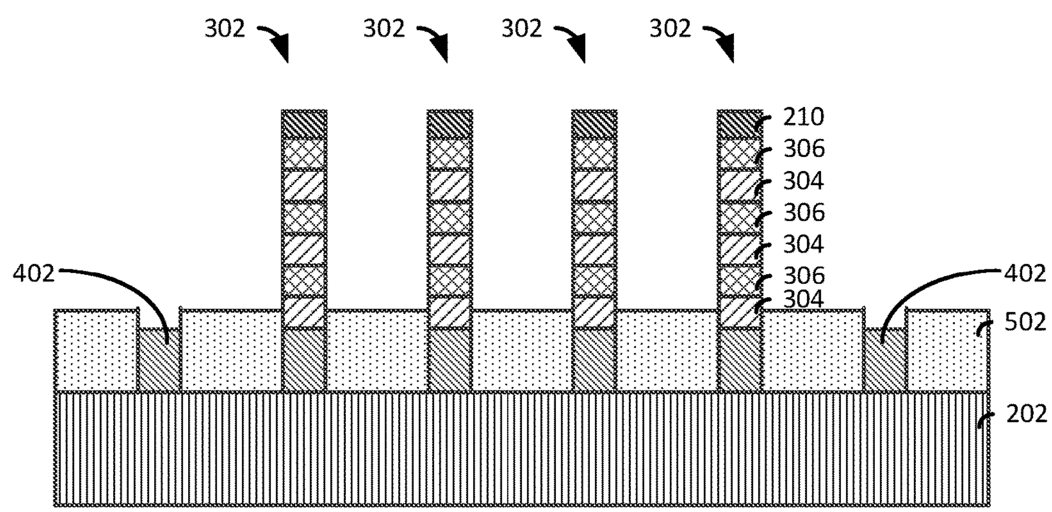

FIG. 7 illustrates a cut-away view along the line A-A (of FIG. 8) of the resultant structure following the removal of the mask 601. The mask 601 may be removed by, for example, an ashing process. The ashing process may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 8:
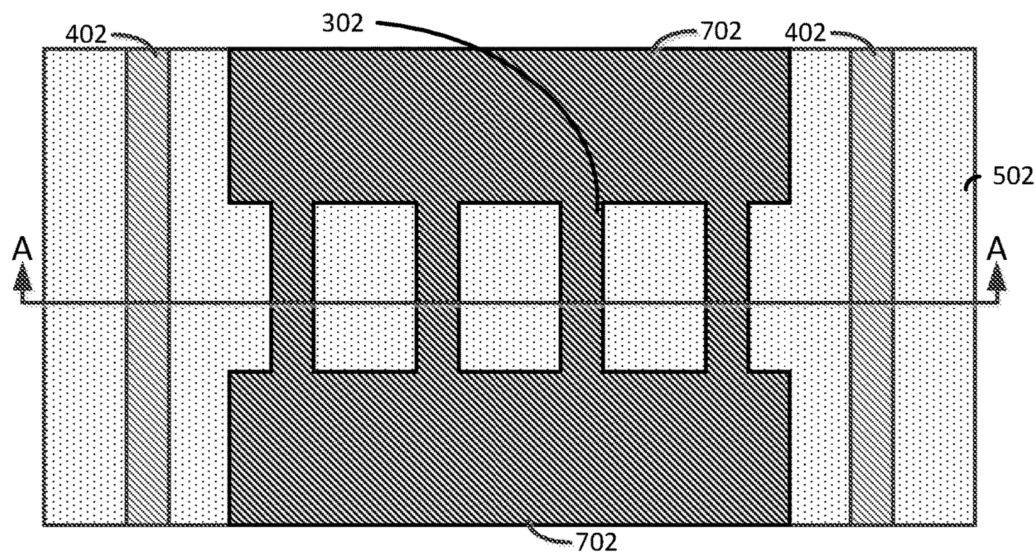

FIG. 8 illustrates a top view of the resultant structure shown in FIG. 7. In the illustrated exemplary embodiment, pads 702 are arranged at distal ends of the stacks of nanowires 302. The pads 702 were patterned during the formation of the stacks of nanowires 302 described above in FIG. 3.

Figure 9:
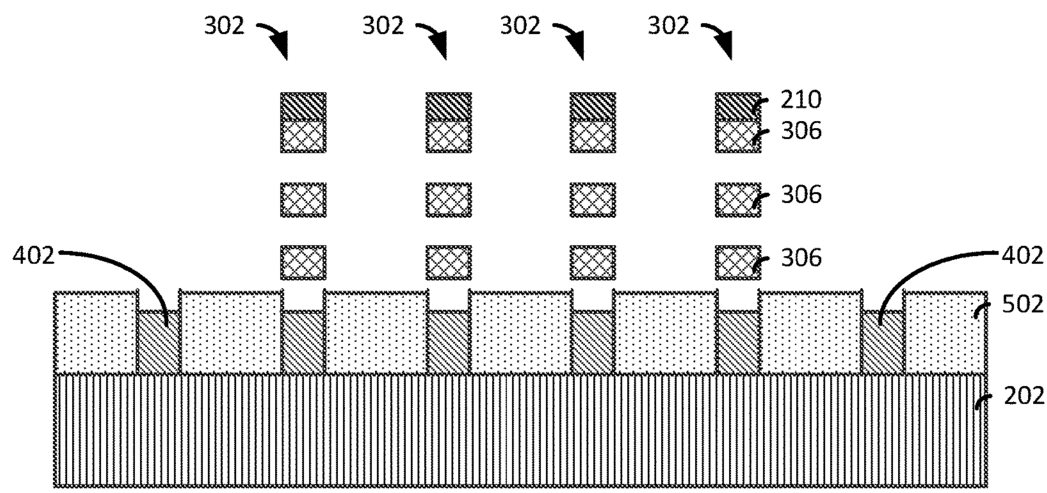

FIG. 9 illustrates a cut-away view through the second nanowires 306 following the removal of exposed portions of the first nanowires 304 (of FIG. 7). In this regard, since the first nanowires 304 and the second nanowires 306 are formed from different materials, a selective isotropic etching process is used to remove the exposed portions of the first nanowires 304. In the illustrated embodiment, the first nanowires 306 are formed from a SiGe material, and the second nanowires 306 are formed from Si. SiGe can be etched selective to Si, for example, by an aqueous etchant containing hydroperoxide ($H_2O_2$) and ammonia ($NH_4OH$). The selectively oxidizable material 402 in the illustrated embodiment are formed from SiGe having a relatively lower concentration of Ge (e.g., about >10% lower) than the concentration of Ge in the SiGe used to form the first nanowires 304. The differences in concentration of Ge between the sacrificial fins 402 and the first nanowires 304 allow for a selective isotropic etching process to selectively remove the first nanowires 304.

Figure 10:
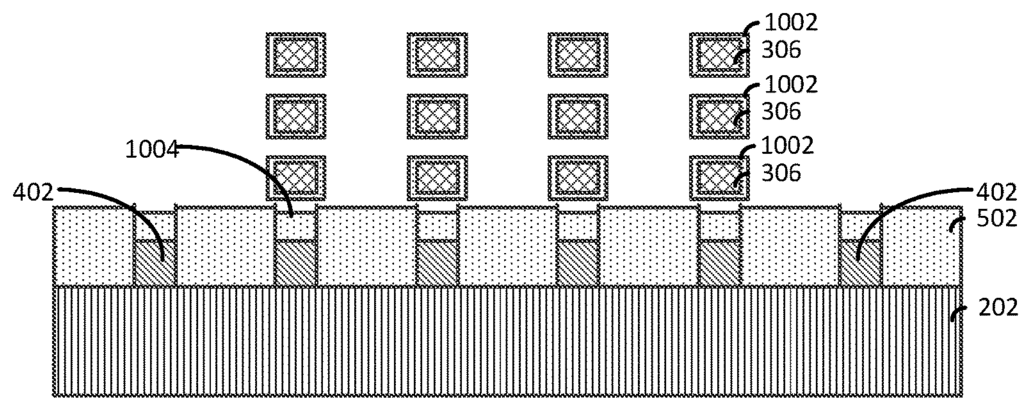

FIG. 10 illustrates a cut-away view along the line A-A (of FIG. 11) following an oxidation process. The oxidation process forms a first oxide layer 1002 on exposed surfaces of the second nanowires 306. The process also forms a second oxide layer 1004 over exposed portions of the sacrificial fins 402.

In this regard, the second nanowires 306 are formed from silicon and the sacrificial fins 402 are formed from SiGe. The oxidation process is operative to form oxide material on exposed SiGe at a faster rate than oxide material formed on exposes Si. Thus, the first oxide layer 1002 is relatively thin compared to the second oxide layer 1004 that is formed on the exposed sacrificial fins 402. Though the illustrated embodiments describe second nanowires 306 formed from Si and sacrificial fins 402 formed from SiGe, alternate exemplary embodiments may include any combination of dissimilar semiconductor materials that may be oxidized using an oxidation process with dissimilar oxidation rates for the dissimilar semiconductor materials.

In the illustrated exemplary embodiment the oxidation process is performed at a temperature of between about 350 and 650 degrees Celsius and pressure of between about 1 and 500 atmospheres, in an O2 or H2O containing ambient.

Figure 11:
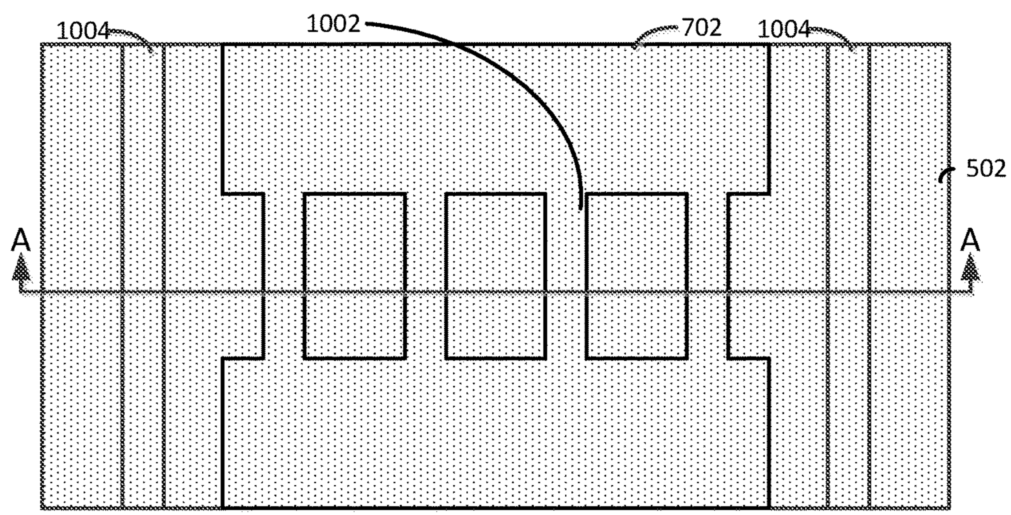

FIG. 11 illustrates a top view of the first oxide layer 1002 and the second oxide layer 1004 following the oxidation process described above in FIG. 10.

Figure 12:
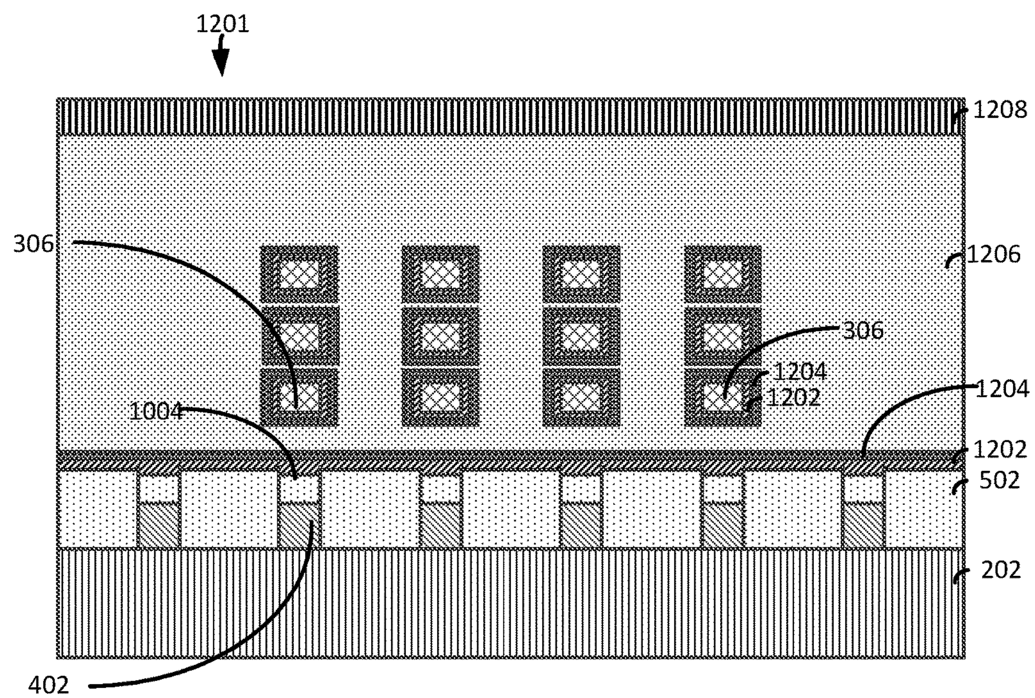

FIG. 12 illustrates a cut-away view along the line A-A (of FIG. 13) following the formation of a gate stack 1201 over channel regions of the second nanowires 306. Prior to forming the gate stack 1201, the first oxide layer 306 (of FIG. 10) may be removed by, for example, a pre-gate formation cleaning process that removes the oxide from the second nanowires 306 to expose the second nanowires 306.

The gate stack 1201 includes high-k metal gates formed, for example, depositing and patterning one or more gate dielectric 1202 materials, one or more workfunction metals 1204, and one or more metal gate conductor 1206 materials. The gate dielectric 1202 material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1202 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1204 may be disposed over the gate dielectric 1202 material. The type of work function metal(s) 1204 depends on the type of transistor and may differ between the nFET and pFET devices. Non-limiting examples of suitable work function metals 1204 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1206 material(s) is deposited over the gate dielectric 1202 materials and work function metal(s) 1204 to form the gate stack 1201. Non-limiting examples of suitable conductive metals include aluminum (Al), platinum (Pt), gold (Au), tungsten (W), titanium (Ti), or any combination thereof. The gate conductor 1206 material(s) may be deposited by a suitable deposition process, for example, CVD, PECVD, PVD, plating, thermal or e-beam evaporation, and sputtering.

Following the deposition of the gate dielectric 1202 materials, the work function metal(s) 1204, and the gate conductor 1206 material(s), a gate cap layer 1208 is deposited on the gate conductor 1206. A lithographic patterning and etching process is performed to define the gate stack 1201.

Figure 13:
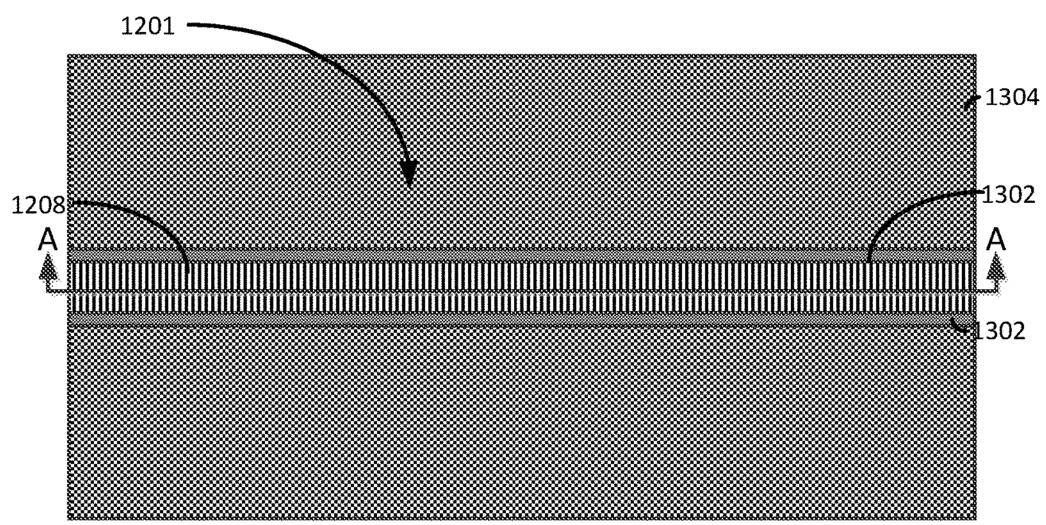

FIG. 13 illustrates a top view of the gate stack 1201, spacers 1302, and an inter-level dielectric layer 1304 that is formed over source/drain regions of the device. Following the patterning of the gate stack 1201, the spacers 1302 are formed along sidewalls of the gate stack 1201. The spacers 1302 in the illustrated embodiment are formed by depositing a layer of spacer material (not shown) over the exposed portions of the gate stack 1201 and the STI region 502. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1302.

Prior to forming the inter-level dielectric layer 1304, source/drain regions (not shown) may be formed by, for example, an ion implantation process, or an in-situ epitaxial growth process that includes dopants.

The inter-level dielectric layer 1304 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1304 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1304, a planarization process such as, for example, chemical mechanical polishing is performed.

Referring to FIG. 12, the embodiments described above provide for the formation of an insulating material (the second oxide layer 1004) that is arranged between the sacrificial fins 402 and the gate dielectric 1202 materials. The second oxide layer 1004 reduces or substantially removes undesirable capacitance that may occur between the gate and the substrate 202 (and/or sacrificial fins 402) by isolating the gate stack 1201 from the sacrificial fins 402 and the substrate 202.

FIGS. 14-22 illustrate an alternate exemplary method for forming a gate-all-around device using a gate-last process.

Figure 14:
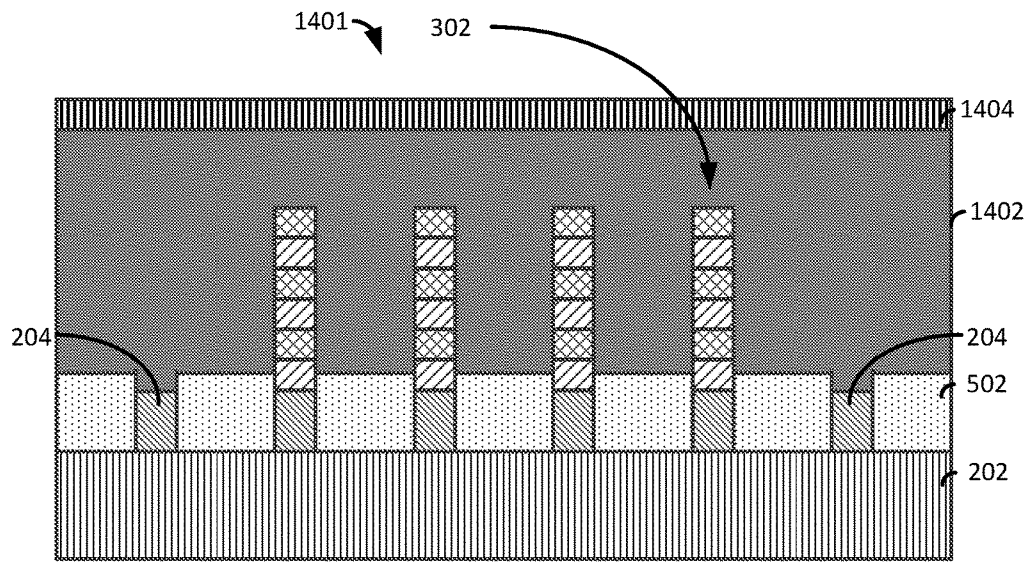
FIGS. 14-22 illustrate an alternate exemplary method for forming a gate-all-around device using a gate-last process.

In this regard, FIG. 14 illustrates a side view following the formation of a sacrificial gate 1401 and spacers 1402 over portions of the stacks of nanowires 302 and the STI region 502. The sacrificial gate 1401 is formed following the formation of the stacks of nanowires 302 as described above in FIGS. 1-7.

The sacrificial gate 1401 in the exemplary embodiment is formed by depositing a layer (not shown) of sacrificial gate material such as, for example, amorphous silicon (aSi), or polycrystalline silicon (polysilicon) material or another suitable sacrificial gate material. The sacrificial gate 1401 may further comprise a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 1404. The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 1401 and the sacrificial gate caps 1404.

Figure 15:
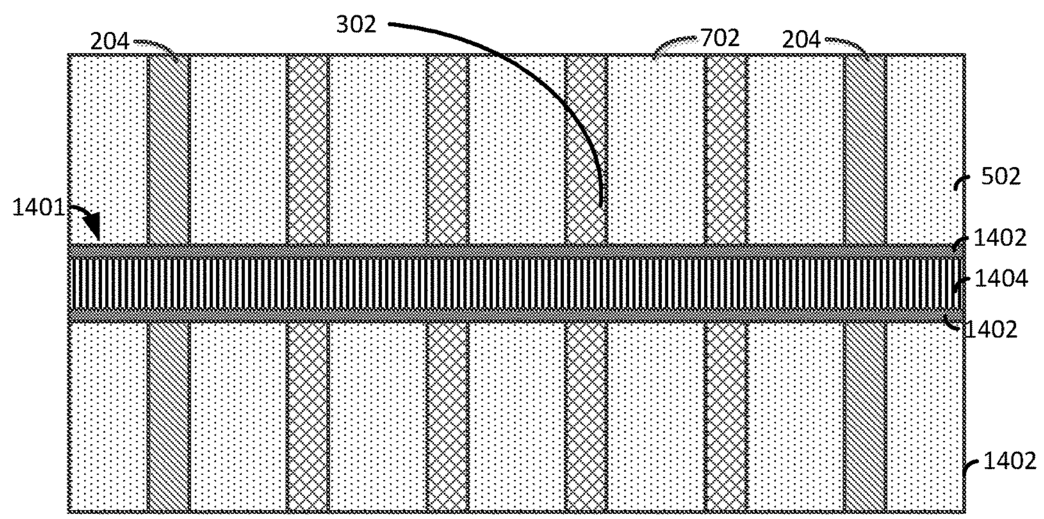

FIG. 15 illustrates a top view following the formation of the sacrificial gate 1401 and the spacers 1402 along sidewalls of the sacrificial gate 1401. The spacers 1402 are formed by a spacer material deposition and etching process similar to the process described above in FIG. 13.

Figure 16:
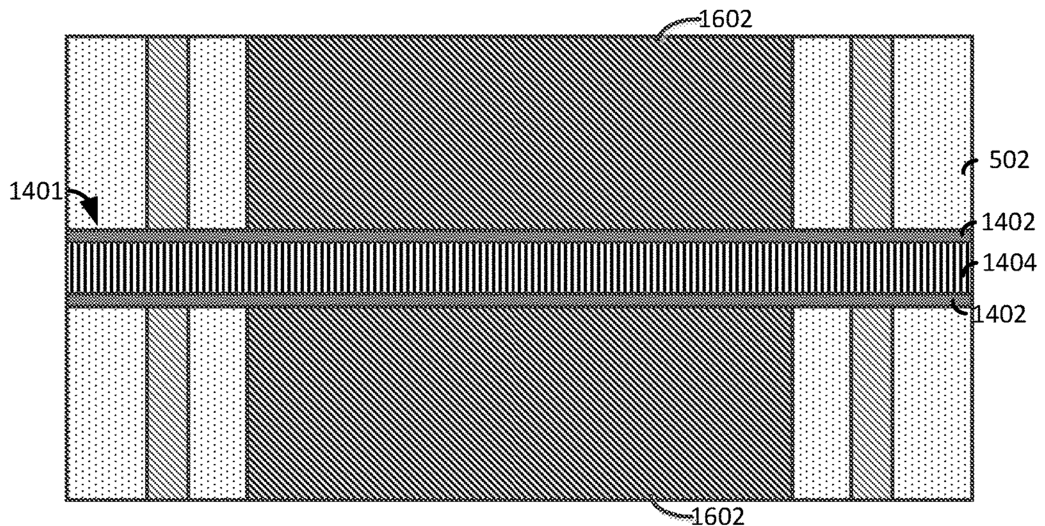

FIG. 16 illustrates a top view following the formation of source/drain regions 1602 adjacent to the spacers 1402. The source/drain regions 1602 are formed by an epitaxial growth process that deposits a crystalline overlayer of semiconductor material onto the exposed crystalline seed material of the exposed stacks of nanowires 302 to form the source/drain regions 1602.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $2\times10^{21}$ $cm^{-3}$, or preferably between $2\times10^{20}$ $cm^{-3}$ to $1\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 17:
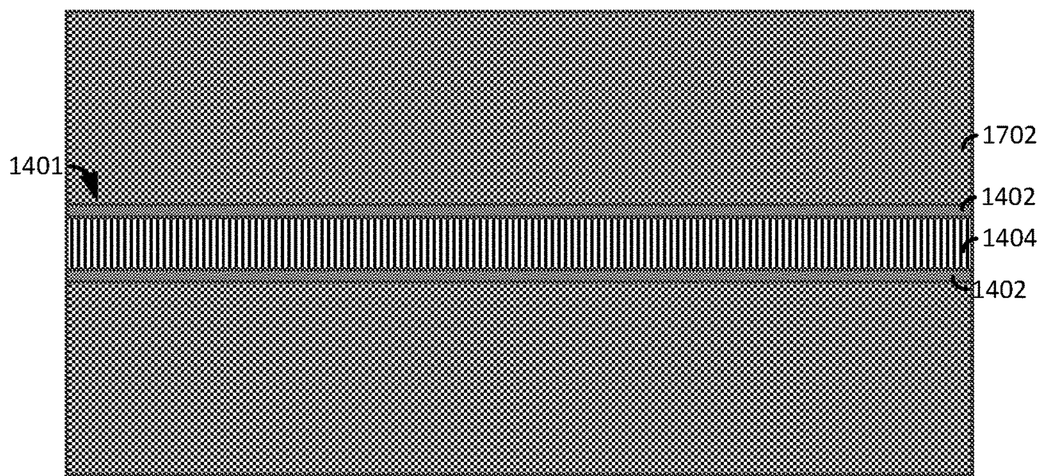

FIG. 17 illustrates a top view following the deposition of an inter-level dielectric layer 1702 over the exposed source/drain regions 1602 (of FIG. 16). The inter-level dielectric layer 1702 is formed by a similar process as described above in FIG. 13.

Figure 18:
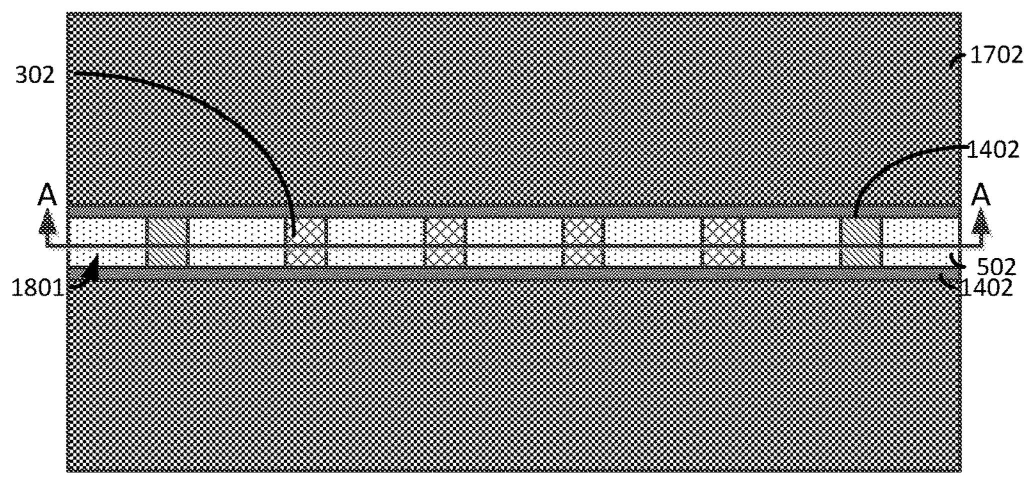

FIG. 18 illustrates a top view of the resultant structure following the removal of the sacrificial gates 1401 (of FIG. 17) to form cavities 1801 that expose the channel regions of the stack of nanowires 302. The sacrificial gates 1401 may be removed by performing a dry etch process, for example, ME, followed by a wet etch process. The wet etch process is selective to (will not substantially etch) the spacers 1402, the nanowires 302, and the inter-level dielectric material. The chemical etch process may include, but is not limited to, hot ammonia or tetramethylammonium hydroxide (TMAH).

Figure 19:
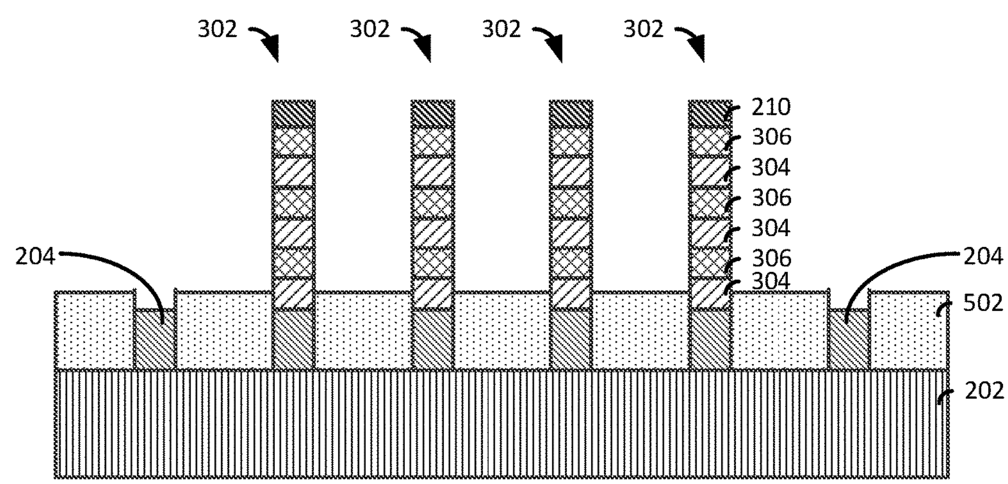

FIG. 19 illustrates a cut-away view along the line A-A (of FIG. 18) following the removal of the sacrificial gate 1401 (of FIG. 17).

Figure 20:
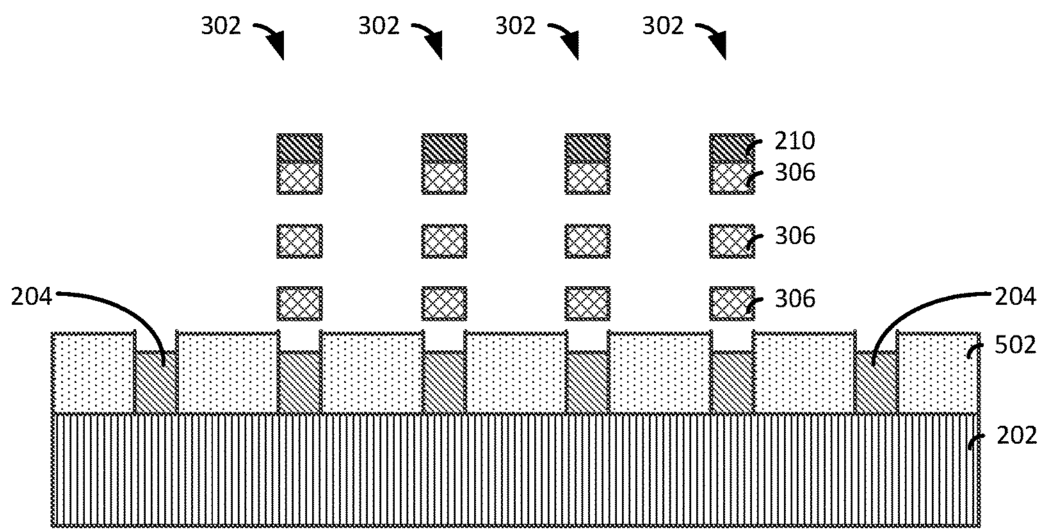

FIG. 20 illustrates a cut-away view through the channel region of the device following a selective isotropic etching process that removes exposed portions of the first nanowires 304. The first nanowires 304 are removed using a similar process as described above in FIG. 9.

Figure 21:
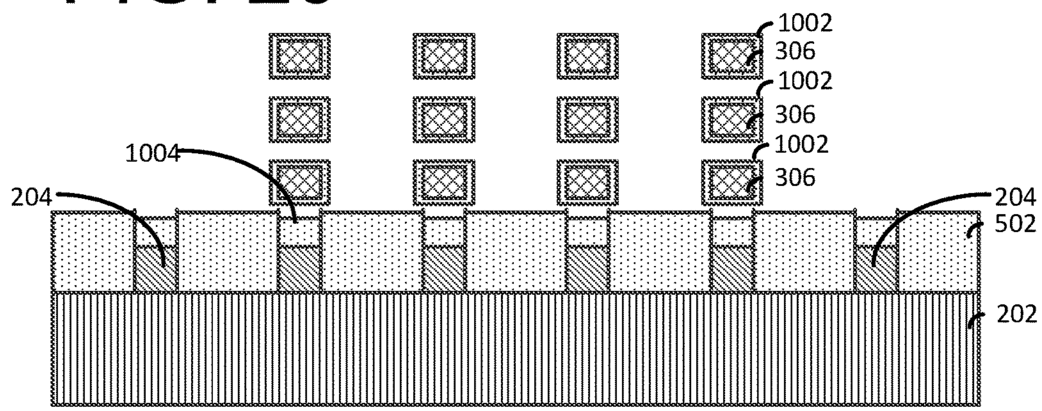

FIG. 21 illustrates a cut-away view of the channel region of the device following an oxidation process that forms a first oxide layer 1002 on exposed surfaces of the second nanowires 306. The process also forms a second oxide layer 1004 over exposed portions of the sacrificial fins 402. The oxidation process is similar to the process described above in FIG. 10.

Figure 22:
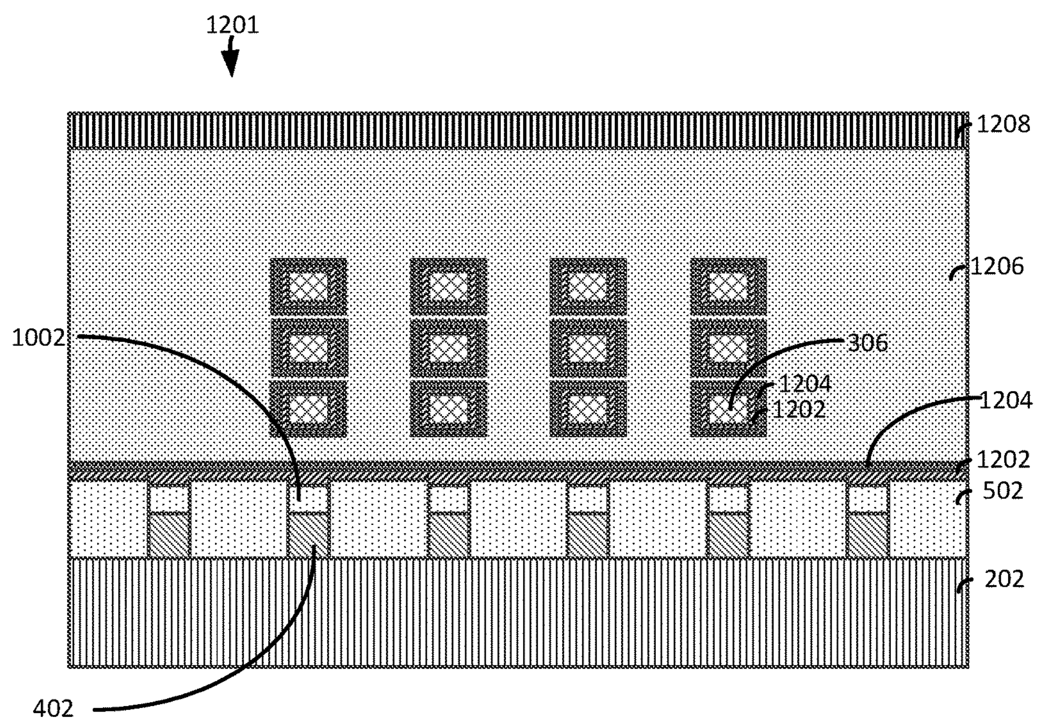

FIG. 22 illustrates the resultant structure following the formation of a gate stack 1201 in the cavity 1801 that is formed in a similar manner as discussed above in FIG. 12. Prior to the formation of the gate stack 1201, the first oxide layer 1002 is removed using, for example, a pre-clean process that removes the first oxide layer 1002 and exposes the second nanowires 306.

Referring to FIG. 21, the embodiments described above provide for the formation of an insulating material (the second oxide layer 1004) that is arranged between the sacrificial fins 402 and the gate dielectric 1202 materials. The second oxide layer 1004 reduces or substantially removes undesirable capacitance that may occur between the gate and the substrate 202 (and/or sacrificial fins 402) by isolating the gate stack 1201 from the sacrificial fins 402 and the substrate 202.

Figure 23:
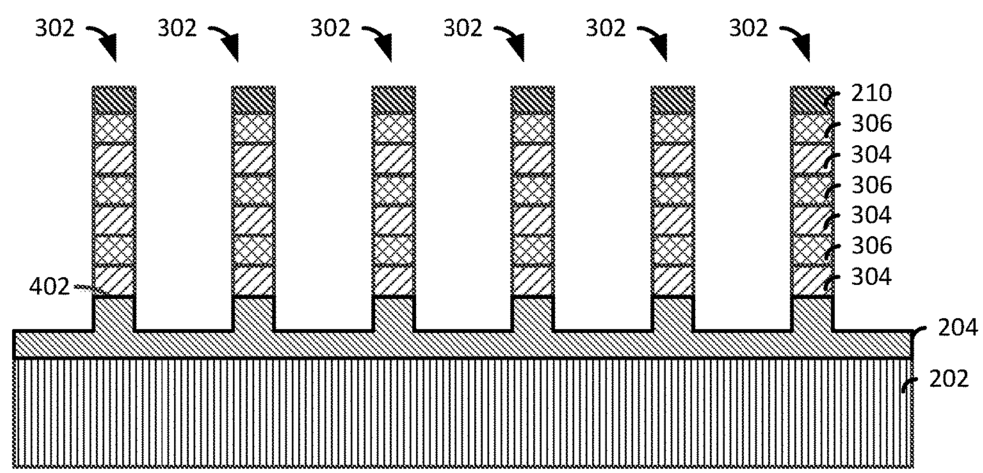
FIGS. 23-25 illustrate another exemplary method for fabricating a gate-all-around device.
Figure 24:
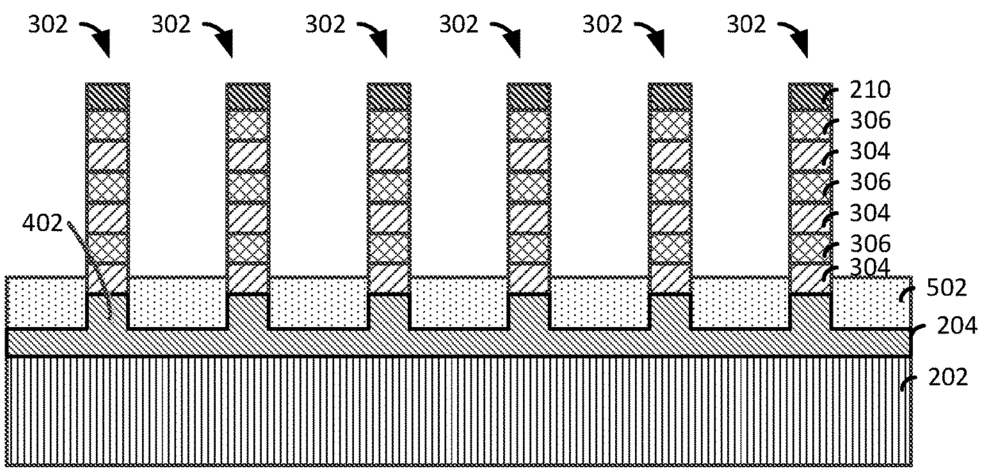
Figure 25:
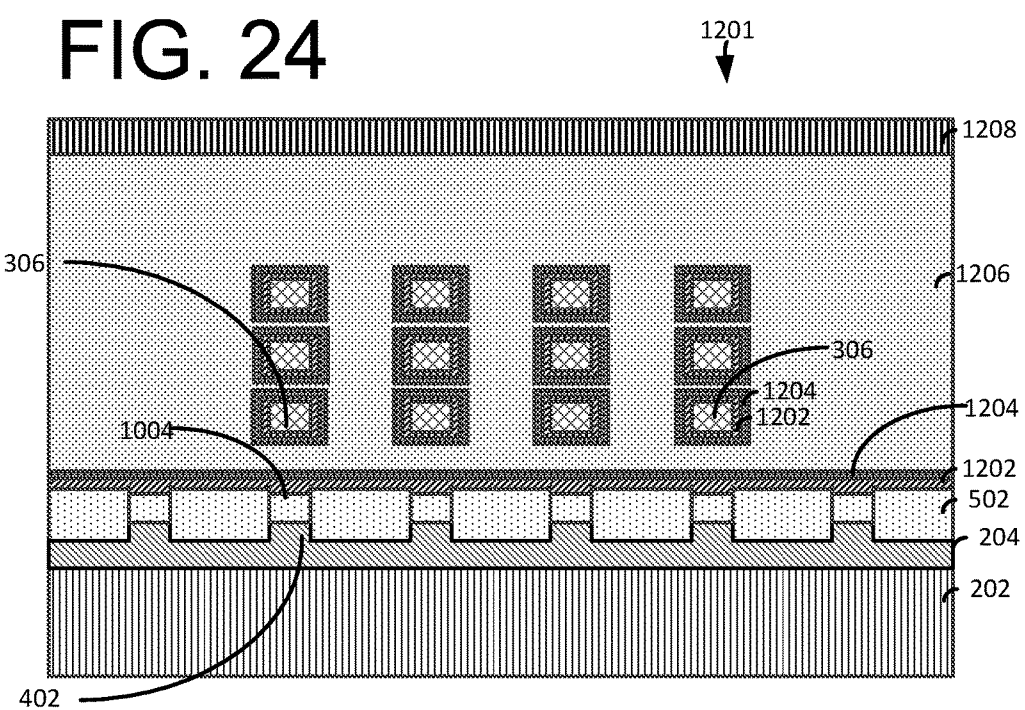

FIGS. 23-25 illustrate another exemplary method for fabricating a gate-all-around device.

FIG. 23 illustrates a side view following the formation of the stacks of nanowires 302 and the sacrificial fins 402. In the illustrated exemplary embodiment, the fins 402 have been patterned using an anisotropic etching process that removes portions of the layer of selectively oxidizable material 204 without exposing the substrate 202.

FIG. 24 illustrates a side view following the formation of the STI region 502 adjacent to the stacks of nanowires 302 using a similar process as described above in FIG. 5.

FIG. 25 illustrates a side view following the formation of the gate stack 1201 over the nanowires 306. The gate stack 1201 is formed using a similar process as described above in FIG. 12.

The embodiments described above in FIG. 25 provide for the formation of an insulating material (the second oxide layer 1004) that is arranged between the sacrificial fins 402 and the gate dielectric 1202 materials. The second oxide layer 1004 reduces or substantially removes undesirable capacitance that may occur between the gate and the substrate 202 (and/or sacrificial fins 402) by isolating the gate stack 1201 from the sacrificial fins 402 and the substrate 202.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

a fin including a first semiconductor material on a substrate, wherein the first semiconductor material includes silicon germanium having a first concentration of germanium in the silicon germanium;

a nanowire over the fin, the nanowire including a second semiconductor material, wherein the second semiconductor material includes silicon germanium having a second concentration of germanium in the silicon germanium; and wherein the first concentration is at least 10% less than the second concentration;

a first layer of oxide material on exposed portions of the nanowire and a second layer of oxide material on the fin, the first layer of oxide material having a first thickness and the second layer of oxide material having a second thickness, where the first thickness is less than the second thickness; and a gate stack over a channel region of the nanowire, the gate stack including a gate dielectric layer on the nanowire and directly on the second layer of oxide material, a workfunction metal on the gate dielectric layer, and a gate conductor on the workfunction metal.

2. The device of claim 1 further comprising a layer of insulator material on the substrate adjacent to the fin.

3. The device of claim 1, wherein the second semiconductor material includes Si.

4. The device of claim 1, wherein the first semiconductor material and the second semiconductor material include dissimilar materials.

5. The device of claim 4, wherein the dissimilar materials have dissimilar oxidation rates.

6. A semiconductor device comprising:

a fin including a first semiconductor material on a substrate, wherein the first semiconductor material includes silicon germanium having a first concentration of germanium in the silicon germanium; and a nanowire over the fin, the nanowire including a second semiconductor material, wherein the second semiconductor material includes silicon germanium having a second concentration of germanium in the silicon germanium; and wherein the first concentration is at least 10% less than the second concentration;

oxide material on the fin; and a gate stack over a channel region of the nanowire, the gate stack including a gate dielectric layer on the nanowire and directly on the oxide material, a workfunction metal on the gate dielectric layer, and a gate conductor on the workfunction metal.

7. The device of claim 6, wherein the second semiconductor material includes Si.

8. The device of claim 7, wherein the workfunction metal is on the gate dielectric layer on the layer of insulator material.

9. The device of claim 6, wherein the first semiconductor material and the second semiconductor material include dissimilar materials.

10. The device of claim 9, wherein the dissimilar materials have dissimilar oxidation rates.

11. The device of claim 6 further comprising a layer of insulator material on the substrate adjacent to the fin.

12. The device of claim 6, wherein the gate dielectric layer is on the layer of insulator material.

13. A semiconductor device comprising:

a substrate;

a fin arranged on the substrate, the fin including a first semiconductor material, wherein the first semiconductor material includes silicon germanium having a first concentration of germanium in the silicon germanium;

a layer of oxide material arranged on the fin;

a nanowire comprising a semiconductor material arranged over the layer of oxide material where the layer of oxide material is disposed between the fin and the nanowire; and wherein the second semiconductor material includes silicon germanium having a second concentration of germanium in the silicon germanium; and wherein the first concentration is at least 10% less than the second concentration;

a gate stack arranged around the nanowire and over the layer of oxide material, the gate stack including a gate dielectric layer on the nanowire and directly on the oxide material, a workfunction metal on the gate dielectric layer, and a gate conductor on the workfunction metal.

14. The device of claim 13, wherein the nanowire includes Si.

15. The device of claim 13 further comprising a layer of insulator material on the substrate adjacent to the fin.

16. The device of claim 13 wherein the fin and the nanowire include dissimilar materials.

17. The device of claim 16, wherein the dissimilar materials have dissimilar oxidation rates.

* * * * *